United States Patent
Wilson et al.

(10) Patent No.: US 7,411,231 B2
(45) Date of Patent: Aug. 12, 2008

(54) JFET WITH DRAIN AND/OR SOURCE MODIFICATION IMPLANT

(75) Inventors: Craig Wilson, Livermore, CA (US); Derek Bowers, Los Altos Hills, CA (US); Gregory K. Cestra, Pleasanton, CA (US)

(73) Assignee: Analog Devices, Inc., Norwood, MA (US)

( * ) Notice: Subject to any disclaimer, the term of this patent is extended or adjusted under 35 U.S.C. 154(b) by 133 days.

(21) Appl. No.: 11/566,099

(22) Filed: Dec. 1, 2006

(65) Prior Publication Data

US 2007/0145410 A1 Jun. 28, 2007

Related U.S. Application Data

(60) Provisional application No. 60/753,645, filed on Dec. 22, 2005.

(51) Int. Cl.
*H01L 29/80* (2006.01)
*H01L 21/337* (2006.01)
(52) U.S. Cl. ............... 257/256; 257/272; 257/E29.314; 438/186; 438/194
(58) Field of Classification Search ................ 257/256, 257/272, E29.314; 438/186, 194, 195
See application file for complete search history.

(56) References Cited

U.S. PATENT DOCUMENTS

| 4,176,368 | A | * | 11/1979 | Compton | 257/285 |
| 4,816,880 | A | * | 3/1989 | Muro | 257/285 |
| 5,008,719 | A | | 4/1991 | Schrantz | 357/22 |
| 5,907,168 | A | * | 5/1999 | Childs | 257/256 |

FOREIGN PATENT DOCUMENTS

| JP | 61073380 | 4/1986 |
| JP | 2000174035 | 6/2000 |
| WO | WO 2007/075759 A3 * | 7/2007 |

* cited by examiner

*Primary Examiner*—Tuan N. Quach
(74) *Attorney, Agent, or Firm*—Koppel, Patrick, Heybl & Dawson

(57) ABSTRACT

The present invention provides a JFET which receives an additional implant during fabrication, which extends its drain region towards its source region, and/or its source region towards its drain region. The implant reduces the magnitude of the e-field that would otherwise arise at the drain/channel (and/or source/channel) junction for a given drain and/or source voltage, thereby reducing the severity of the gate current and breakdown problems associated with the e-field. The JFET's gate layer is preferably sized to have a width which provides respective gaps between the gate layer's lateral boundaries and the drain and/or source regions for each implant, with each implant implanted in a respective gap.

20 Claims, 3 Drawing Sheets

JFET WITH DRAIN AND/OR SOURCE MODIFICATION IMPLANT

RELATED APPLICATIONS

This application claims the benefit of provisional patent application No. 60/753,645 to Wilson et al., filed Dec. 22, 2005.

BACKGROUND OF THE INVENTION

1. Field of the Invention

This invention relates generally to field effect transistors (FETs), and, more particularly, to junction field effect transistors (JFETs).

2. Description of the Related Art

Junction field effect transistors (JFETs) are found in many applications, such as electronic switches and voltage-controlled resistances. The structure of a conventional JFET is shown in FIG. 1. This P-type JFET comprises an N-type bottom gate layer 10, P+ source and drain regions 14 and 16 recessed into N-type layer 10, a P-type layer 18 recessed into the surface of the N layer between the source and drain regions, and an N-type top gate layer 20 recessed into the surface of P-type layer 18 between the source and drain regions. Contacts are provided to the source and drain regions and the gate layers to provide the device's source (S), drain (D) and gate (G) terminals. Layer 18 serves as a P-channel which provides a current path between the source and drain regions.

With no voltage applied to gate terminal G, current flows easily when a voltage is applied between the source and drain terminals. Current flow is modulated by applying a voltage ($V_{gs}$) between gate terminal G and source terminal S. The polarity of $V_{gs}$ is such that it reverse-biases the p-n junction between the gate and channel. This creates a depletion region which extends into the channel. The width of the depletion region varies with $V_{gs}$, with an increasing reverse-bias serving to widen the depletion region and thereby pinch off the channel and reduce the device's drain current. In this way, the $V_{gs}$ voltage controls the conductance of the channel.

One inherent disadvantage of the JFET is its non-zero gate current. Voltages applied to the JFET's drain terminal give rise to an electric field (e-field) at its drain/P-channel junction. The e-field causes impact ionization to occur at the junction, which leads to the generation of carriers that are swept into the gate—thereby creating a gate current which may increase to an unacceptably high level with increasing drain voltage.

The e-field at the drain/channel (or source/channel) junction can also result in the device having a poor breakdown voltage characteristic. When the e-field reaches a critical level, the impact ionization current is essentially so high that drain current increases almost independently of drain voltage; this critical level defines the device's breakdown voltage, which may be unacceptably low for some JFETs.

SUMMARY OF THE INVENTION

The present invention provides a JFET which receives an additional implant during fabrication, which extends its drain region towards its source region, and/or its source region towards its drain region. The implant serves to reduce the magnitude of the e-field that would otherwise arise at the drain/channel (and/or source/channel) junction for a given drain and/or source voltage, thereby reducing the severity of the gate current and breakdown problems associated with the e-field.

A JFET in accordance with the present invention can be P-type or N-type. A P-type JFET comprises an N-type bottom gate layer, P-type source and drain regions recessed into the surface of the N layer, a P-type layer recessed into the surface of the N layer between the source and drain regions, and an N-type top gate layer recessed into the surface of the P layer between the source and drain regions. This structure provides a P-channel between the source and drain regions, located immediately below the top gate layer.

A P-type JFET per the present invention also includes a P-type implant, located such that the implant contacts and extends the drain region toward the source region, and/or the source region toward the drain region. The implant is arranged such that it reduces the magnitude of the e-field that would otherwise arise at the drain/channel (and/or source/channel) junction for a given drain (and/or source) voltage, thereby improving the device's gate current and breakdown characteristics.

The present JFET's gate layer is preferably sized to have a width which provides respective gaps between the gate layer's lateral boundaries and the drain and/or source regions for each implant, with each implant implanted in a respective gap. The depth of the implant should be equal to or greater than the depth of the channel.

These and other features, aspects, and advantages of the present invention will become better understood with reference to the following drawings, description, and claims.

DETAILED DESCRIPTION OF THE INVENTION

Figure 2:
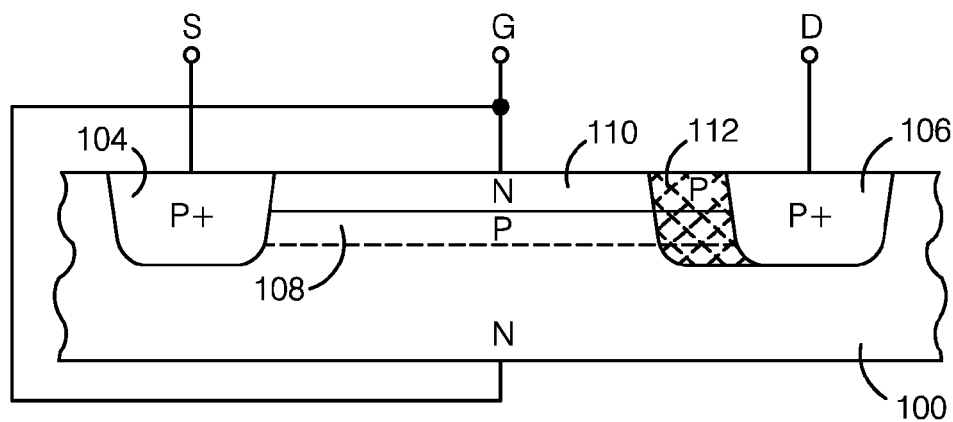
FIG. 2 is a sectional view of one possible embodiment of a P-type JFET per the present invention.

A JFET in accordance with the present invention is shown in FIG. 2. A P-type JFET is shown; however, the invention is equally applicable to an N-type JFET.

For the exemplary embodiment shown in FIG. 2, the JFET is made from an N-type bottom gate layer 100, with a P+ source region 104 and a P+ drain region 106 recessed into the surface of N-type layer 100 and spaced apart from each other. A P-type layer 108 is recessed into the surface of N-type layer 100 between the source and drain regions, and an N-type top gate layer 110 is recessed into the surface of P-type layer 108 between the source and drain regions. P-type layer 108, located immediately below top gate layer 110, serves as a P-type channel through which current flows between the source and drain regions. Source and drain terminals ('S' and 'D') are connected to the source and drain regions, respectively, and a gate terminal ('G') connects to both N-type top gate layer 110 and N-type bottom gate layer 100. As with a conventional JFET, applying a potential to the gate terminal which reverse-biases the p-n junction between the gate and channel creates a depletion region which extends into the channel. The width of the depletion region varies with the JFET's gate-source voltage $V_{gs}$, with an increasing reverse-bias serving to widen the depletion region and thereby pinch off the channel and reduce the device's drain current.

As noted above, e-fields form at the JFET's drain/channel and/or source/channel junctions when a voltage is applied to the drain and/or source terminals. These e-fields cause impact ionization to occur at the junctions, which leads to the generation of carriers that are swept into the gate—thereby creating a gate current which may increase to an unacceptably high level with increasing applied voltage.

The invention mitigates this problem with the use of one or more implants, which can be located adjacent to the drain region, adjacent to the source region, or adjacent to both drain and source regions. For the exemplary P-type JFET in FIG. 2, a P-type implant 112 is performed such that the implant contacts and extends drain region 106 towards source region 104. The presence of implant 112 acts to reduce the magnitude of the e-field that would otherwise arise at the junction of drain region 106 and P-type channel 108 for a given drain voltage, thereby reducing the impact ionization and consequent gate current that result from the e-field.

Reducing the e-field magnitude in this way also serves to improve the JFET's breakdown voltage characteristic. As the highest e-fields occur at the junction of P-channel 108 and drain region 106, implant 112 preferably has a depth which is equal to or greater than that of channel 108 to have the greatest impact on the reduction of e-field magnitude at the junction. Note that other factors, including the doping concentrations of the gate, channel and drain regions, and the shape/profile of the drain region, also affect the device's breakdown voltage characteristic.

It is preferred that the top gate layer be sized to have a width which leaves a gap between the lateral boundary of the top gate layer nearest the drain region and the drain region (and/or the lateral boundary of the top gate layer nearest the source region and the source region), and that the implant be located in the gap. By so doing, the effectiveness of the implant is increased.

Figure 3:
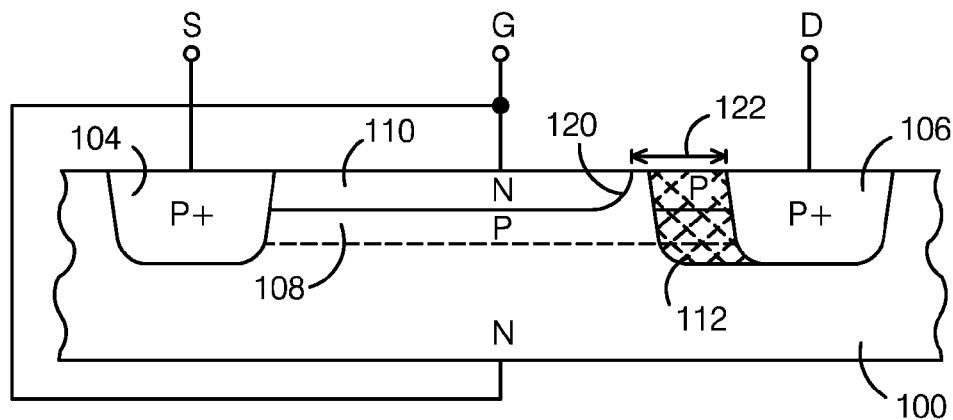
FIG. 3 is a sectional view of another possible embodiment of a P-type JFET per the present invention.

This technique is illustrated in FIG. 3. The lateral boundary 120 of top gate layer 110 nearest drain region 106 is pulled back from the drain, creating a gap 122. Implant 112 is performed in gap 122. Though some improvement in breakdown performance is obtained just by performing an implant per the present invention, best results are obtained by creating a gap and then performing the implant in the gap as shown in FIG. 3. A suitable gap width is about 1-3 μm; an implant in such a gap would typically serve to extend the width of the drain (or source) region by about 1 μm.

Figure 4:
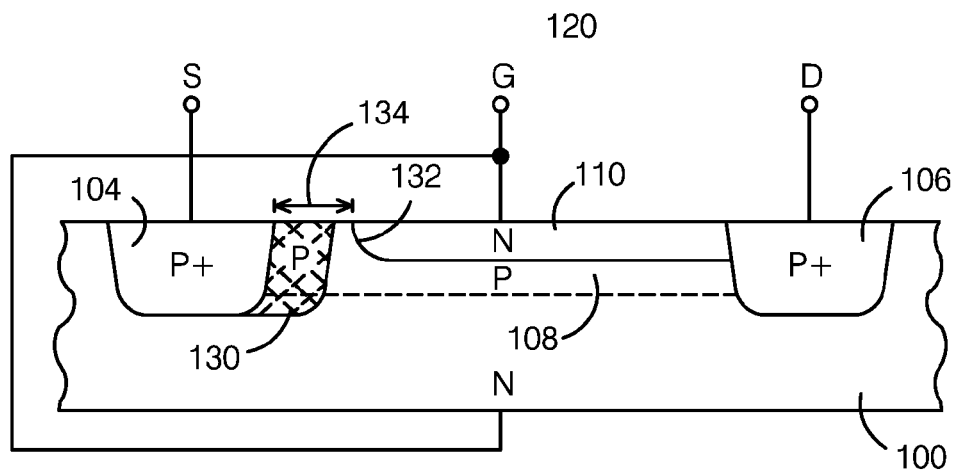
FIG. 4 is a sectional view of another possible embodiment of a P-type JFET per the present invention.

As noted above, an implant per the present invention can be used to extend the drain region toward the source region, the source region toward the drain region, or both—implants are most advantageously employed to extend the regions which see the highest voltages. An exemplary embodiment in which the source region is extended is shown in FIG. 4. Here, a P-type implant 130 is performed such that the implant contacts and extends source region 104 towards drain region 106. The presence of implant 130 acts to reduce the magnitude of the e-field that would otherwise arise at the junction of source region 104 and P-type channel 108 for a given source voltage, thereby reducing the impact ionization and consequent gate current that result from the e-field. As noted above in relation to FIG. 3, the lateral boundary 132 of top gate layer 110 nearest source region 104 is preferably pulled back to provide a gap 134, in which implant 130 is located.

Figure 5:
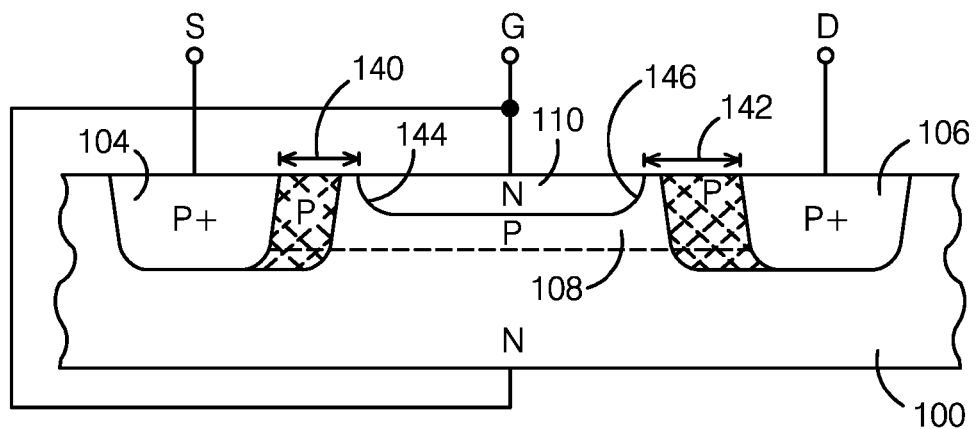
FIG. 5 is a sectional view of another possible embodiment of a P-type JFET per the present invention.

Implants can also be performed to extend both the drain and source regions; this is illustrated in FIG. 5. Here, the width of top gate layer 110 is sized so as to provide gaps 140 and 142 between its lateral boundaries 144 and 146 and the source and drain regions, respectively. This arrangement reduces the e-fields at both the drain/channel and source/channel junctions for given drain and source voltages, respectively, thereby reducing the impact ionization at both junctions, and the consequent gate current that results from the e-fields.

Figure 6:
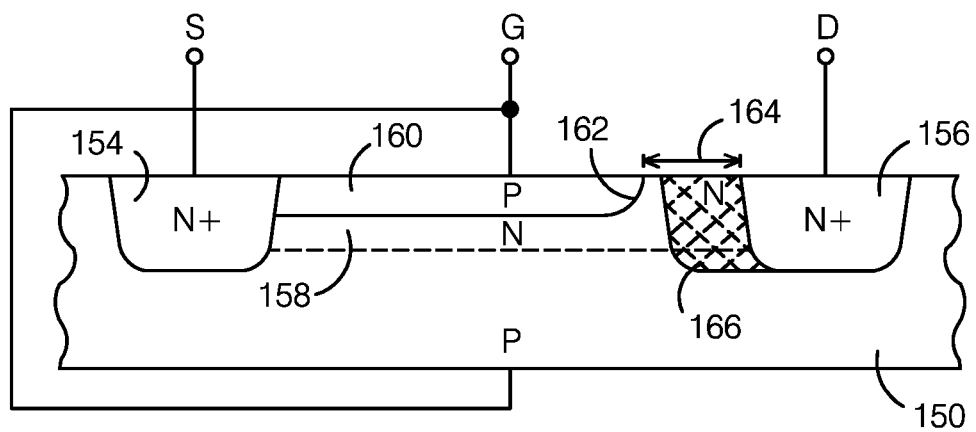
FIG. 6 is a sectional view of one possible embodiment of an N-type JFET per the present invention.

Though P-type JFETs have been illustrated in FIGS. 2-5, the invention is equally applicable to N-type JFETs. One possible embodiment of an N-type JFET per the present invention is shown in FIG. 6. Here, the JFET is made from a P-type bottom gate layer 150, with an N+ source region 154 and an N+ drain region 156 recessed into the surface of P-type layer 150. An N-type layer 158 is recessed into the surface of P-type layer 150 between the source and drain regions, and a P-type top gate layer 160 is recessed into the surface of N-type layer 158 between the source and drain regions. N-type layer 158, located immediately below top gate layer 160, serves as an N-type channel through which current flows between the source and drain regions. The lateral boundary 162 of top gate layer 160 nearest drain region 156 is pulled back from the drain, creating a gap 164. An N-type implant 166 is performed in gap 164, such that it contacts drain region 156 and extends it toward source region 154. As above, for maximum effectiveness, the depth of implant 166 is preferably equal to or greater than that of channel 158.

The doping level of the implant affects the e-field, and therefore gate current, with an optimized doping level resulting in a lower magnitude e-field. Suitable dopants for a P-type implant include boron (B11 or $BF_2$), aluminum or indium, and suitable dopants for an N-type implant include phosphorous, arsenic, or antimony.

A JFET with implant as described herein can be fabricated by means well-known to those familiar with IC processing techniques, with the implant necessitating the performance of one extra masking step and one extra implant step.

An alternative possibility for performing the implant is to combine it with a base implant used for creating superbeta bipolar transistors, using the doping level needed for the base implant. Here, a mask would be used to open a gap for an implant per the present invention, and then both the base implant and present implant would be performed with a single step.

Figure 1:
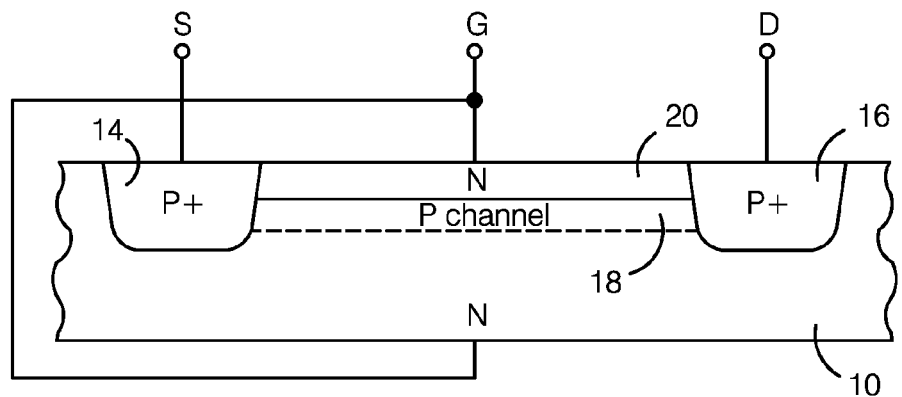
FIG. 1 is a sectional view of a known JFET.
Figure 7:
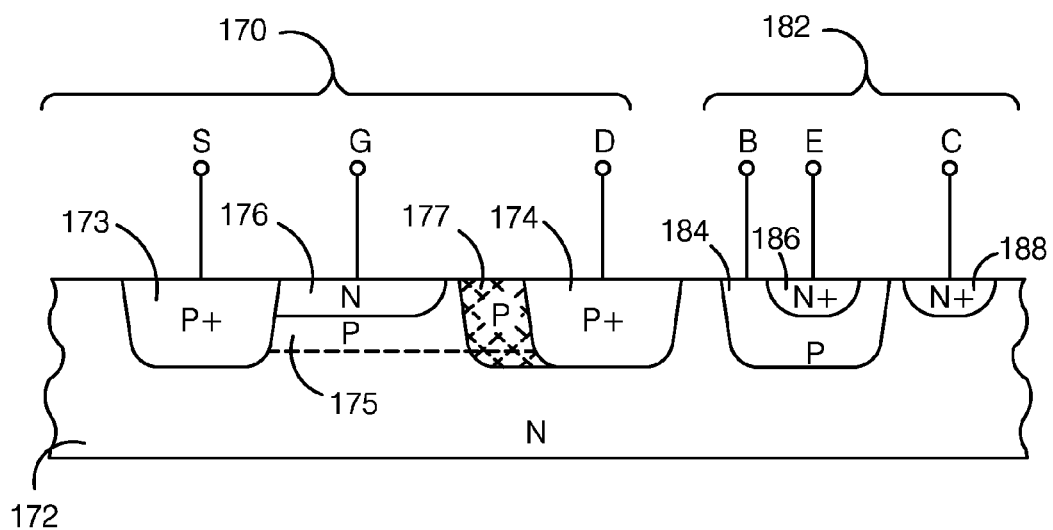
FIG. 7 is a sectional view of one possible embodiment of a P-type JFET and an NPN superbeta bipolar transistor per the present invention.

One possible embodiment of an IC for which both the base and present implants are performed with a single step is shown in FIG. 7. As above, a JFET 170 is formed with an N-type bottom gate layer 172, source and drain regions 173, 174 recessed into layer 172, a P-type channel layer 175 recessed into layer 172 between the source and drain regions, and a top gate layer 176 recessed into layer 175 between the source and drain. Per the present invention, a P-type implant 177 which extends drain region 174 toward source region 173 is also provided as described above.

An NPN superbeta transistor 182 is fabricated on the same substrate, with a P-type base region 184 implanted into N-type layer 172, an N+ emitter region 186 recessed into base region 184, and an N+ collector region 188 recessed into N-type layer 172. Since the JFET's P-type implant 177 and the superbeta's base region are both P-type implants, both may be formed with the same implant step.

Note that, while combining the fabrication of the JFET and superbeta transistors may be expedient, performing an implant per the present invention with a different doping level than that required for superbeta transistors may give better gate current and breakdown voltage characteristics.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A junction field-effect transistor (JFET), comprising:
   a bottom gate layer doped to have a first polarity;
   a source region doped to have a second polarity opposite that of said bottom gate layer recessed into the top surface of said bottom gate layer;
   a drain region of said second polarity recessed into the top surface of said bottom gate layer and spaced apart from said source region;
   a channel layer of said second polarity recessed into the top surface of said bottom gate layer between said source and drain regions;
   a top gate layer of said first polarity recessed into the top surface of said channel layer between said source and drain regions;
   an implant of said second polarity implanted such that said implant contacts and extends said drain and/or source region toward said source and/or drain region, respectively, such that said implant reduces the magnitude of the electric field that would otherwise arise at the junction of said drain and/or source region and said channel layer for a given drain and/or source voltage, respectively.

2. The JFET of claim 1, wherein said top gate layer is sized to have a width which provides respective gaps between the top gate layer's lateral boundaries and said drain and/or source regions for each of said implants, each of said implants implanted in a respective one of said gaps.

3. The JFET of claim 1, wherein said JFET is arranged such that the depth of said implant is equal to or greater than the depth of said channel layer.

4. The JFET of claim 1, wherein said top gate layer is sized to have a width which leaves a gap between the lateral boundary of said top gate layer nearest said drain region and said drain region, and said implant is implanted in said gap such that said implant contacts and extends said drain region towards said source region, such that said implant reduces the magnitude of the electric field that would otherwise arise at the junction of said drain and said channel layer for a given drain voltage.

5. The JFET of claim 1, wherein said top gate layer is sized to have a width which leaves a gap between the lateral boundary of said top gate layer nearest said source region and said source region, and said implant is implanted in said gap such that said implant contacts and extends said source region towards said drain region, such that said implant reduces the magnitude of the electric field that would otherwise arise at the junction of said source and said channel layer for a given source voltage.

6. The JFET of claim 1, wherein said top gate layer is sized to have a width which leaves a first gap between the lateral boundary of said top gate layer nearest said source region and said source region, and a second gap between the lateral boundary of said top gate layer nearest said drain region and said drain region, and first and second ones of said implants are implanted in said first and second gaps, respectively, such that said first implant contacts and extends said source region towards said drain region and such that said second implant contacts and extends said drain region towards said source region, such that said implants reduce the magnitude of the electric fields that would otherwise arise at the junction of said drain and said channel layer for a given drain voltage and at the junction of said source and said channel layer for a given source voltage.

7. The JFET of claim 1, further comprising:
   at least one superbeta bipolar transistor fabricated on said bottom gate layer, said superbeta transistor including a base implant having a given doping level;
   said implant of said second polarity having the same doping level as said base implant, thereby enabling said base implant and said implant of said second polarity to be performed with a single implant step.

8. The JFET of claim 1, wherein said JFET is a P-type JFET, in which:
   said bottom gate layer is an N-type layer;
   said source and drain regions are P+ regions;
   said top gate layer is an N-type layer;
   said channel layer is a P-type layer; and
   said implant is a P-type implant.

9. The JFET of claim 8, wherein said P-type implant comprises boron, aluminum or indium.

10. The JFET of claim 1, wherein said JFET is an N-type JFET, in which:
    said bottom gate layer is an P-type layer;
    said source and drain regions are N+ regions;
    said top gate layer is an P-type layer;
    said channel layer is an N-type layer; and
    said implant is an N-type implant.

11. The JFET of claim 10, wherein said N-type implant comprises phosphorous, arsenic, or antimony.

12. The JFET of claim 1, wherein each of said implants extends said drain and/or source region toward said source and/or drain region, respectively, by about 1 µm.

13. A P-type junction field-effect transistor (JFET), comprising:
    an N-type bottom gate layer;
    a P+ source region recessed into the top surface of said N-type layer;
    a P+ drain region recessed into the top surface of said N-type layer and spaced apart from said source region;
    a P-type channel layer recessed into the top surface of said N-type layer between said source and drain regions;
    an N-type top gate layer recessed into the top surface of said P-type channel layer between said source and drain regions and sized to have a width which leaves a gap between the lateral boundary of said top gate layer nearest said drain region and said drain region; and
    a P-type implant implanted in said gap such that said implant contacts and extends said drain region towards said source region and has a depth which is equal to or greater than the depth of said P-type channel layer, such that said implant reduces the magnitude of the electric field that would otherwise arise at the junction of said drain and said P-type channel for a given drain voltage.

14. An N-type junction field-effect transistor (JFET), comprising:
    a P-type bottom gate layer;
    an N+ source region recessed into the top surface of said P-type layer;
    an N+ drain region recessed into the top surface of said P-type layer and spaced apart from said source region;
    an N-type channel layer recessed into the top surface of said P-type layer between said source and drain regions;
    a P-type top gate layer recessed into the top surface of said N-type channel layer between said source and drain regions and sized to have a width which leaves a gap between the lateral boundary of said top gate layer nearest said drain region and said drain region; and an N-type implant implanted in said gap such that said implant contacts and extends said drain region towards said source region and has a depth which is equal to or greater than the depth of said N-type channel layer, such that said implant reduces the magnitude of the electric field that would otherwise arise at the junction of said drain and said N-type channel layer for a given drain voltage.

15. A method of fabricating a junction field-effect transistor (JFET), comprising:
providing a bottom gate layer doped to have a first polarity;
creating a source region doped to have a second polarity opposite that of said bottom gate layer which is recessed into the top surface of said bottom gate layer;
creating a drain region of said second polarity which is recessed into the top surface of said bottom gate layer and spaced apart from said source region;
creating a channel layer of said second polarity which is recessed into the top surface of said bottom gate layer between said source and drain regions;
providing a top gate layer of said first polarity which is recessed into the top surface of said channel layer between said source and drain regions; and
implanting a region of said second polarity such that said implanted region contacts and extends said drain and/or source region toward said source and/or drain region, respectively, such that said implanted region reduces the magnitude of the electric field that would otherwise arise at the junction of said drain and/or source region and said channel layer for a given drain and/or source voltage, respectively.

16. The method of claim 15, further comprising sizing said top gate layer to have a width which provides respective gaps between the top gate layer's lateral boundaries and said drain and/or source regions for each of said implants, each of said implants implanted in a respective one of said gaps.

17. The method of claim 15, wherein the depth of said implant is equal to or greater than the depth of said channel layer.

18. The method of claim 15, further comprising:
fabricating at least one superbeta bipolar transistor on said bottom gate layer; and
implanting the base of said superbeta transistor and said implant of said second polarity with a single implant step.

19. The method of claim 15, wherein said JFET is a P-type JFET, in which:
said bottom gate layer is an N-type layer;
said source and drain regions are P+ regions;
said top gate layer is an N-type layer;
said channel layer is a P-type layer; and
said implant is a P-type implant.

20. The method of claim 15, wherein said JFET is an N-type JFET, in which:
said bottom gate layer is an P-type layer;
said source and drain regions are N+ regions;
said top gate layer is an P-type layer;
said channel layer is an N-type layer; and
said implant is an N-type implant.

* * * * *